US011378851B2

(12) United States Patent
Hu (10) Patent No.: US 11,378,851 B2
(45) Date of Patent: Jul. 5, 2022

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Li Hu, Hubei (CN)

(73) Assignee: WUHAN CHINA STAR OPTOELECTRONICS TECHNOLOGY CO., LTD, Hubei (CN)

( * ) Notice: Subject to any disclaimer, the term of this patent is extended or adjusted under 35 U.S.C. 154(b) by 271 days.

(21) Appl. No.: 16/641,612

(22) PCT Filed: Nov. 7, 2019

(86) PCT No.: PCT/CN2019/116408
§ 371 (c)(1),
(2) Date: Feb. 24, 2020

(87) PCT Pub. No.: WO2021/017258
PCT Pub. Date: Feb. 4, 2021

(65) Prior Publication Data
US 2021/0405420 A1 Dec. 30, 2021

(30) Foreign Application Priority Data
Jul. 30, 2019 (CN) .......................... 201910693493.4

(51) Int. Cl.
*G02F 1/1345* (2006.01)
*G02F 1/1333* (2006.01)
(52) U.S. Cl.
CPC .... *G02F 1/13452* (2013.01); *G02F 1/133308* (2013.01)

(58) Field of Classification Search
CPC .......... G02F 1/13452; G02F 1/133308; G02F 1/13456; G02F 1/1345; G02F 1/133388; G02F 1/122; G02F 1/13306; G09F 9/00
See application file for complete search history.

(56) References Cited

FOREIGN PATENT DOCUMENTS

| CN | 203365869 U | 12/2013 |
|---|---|---|
| CN | 204406008 U | 6/2015 |
| CN | 204631833 U | 9/2015 |
| CN | 107589612 A | 1/2018 |
| CN | 109188747 A | 1/2019 |

(Continued)

OTHER PUBLICATIONS

ON 109426387 A, machine translation (Year: 2019).*

*Primary Examiner* — Joseph L Williams
*Assistant Examiner* — Jose M Diaz (57) ABSTRACT

The present application provides a display panel and a display device. The display panel includes a display region, a non-display region, and a terminal region. The non-display region includes a lower bezel region at a lower end of the display region. The terminal region is provided with a connecting terminal, the terminal region includes a first terminal region, and the first terminal region is positioned in the lower bezel region, wherein an included angle between a longitudinal direction of a first connecting terminal and a lower bezel in the first terminal region meets a preset condition, and a width of the first connecting terminal is greater than a threshold. This application reduces the width of the lower bezel.

9 Claims, 8 Drawing Sheets

(56) References Cited

FOREIGN PATENT DOCUMENTS

| CN | 109426387 A | 3/2019 |
| CN | 109445649 A | 3/2019 |
| CN | 109976051 A | 7/2019 |

* cited by examiner

DISPLAY PANEL AND DISPLAY DEVICE

FIELD OF INVENTION

The present application relates to the field of display technology, and in particular, to a display panel and a display device.

BACKGROUND OF INVENTION

With the development of display technology, full-screen technology has become a major development trend, and a narrow bezel design of display panels is becoming more and more important.

Technical Problem

Currently, fan-out traces of the display panel are gathered in the middle of a lower bezel of the display panel. The stacking of the fan-out traces causes the connecting terminals to also be gathered in the middle of the lower bezel so that a width of the lower bezel is wider, and it is difficult to achieve a narrow bezel.

Therefore, the current display panels have a technical problem that the width of the lower bezel is wider and needs to be improved.

SUMMARY OF INVENTION

The present application provides a display panel and a display device to solve the technical problem that a width of the lower bezel of the current display panel is wider.

To solve the above problem, the technical solution provided by the present application is as follows:

The application provides a display panel, including:
 a display region;
 a non-display region disposed outside the display region, the non-display region including a lower bezel region, and the lower bezel region positioned at a lower end of the display region; and
 a terminal region, the terminal region provided with a connecting terminal, the terminal region including a first terminal region, and the first terminal region positioned in the lower bezel region, wherein an included angle between a longitudinal direction of a first connecting terminal and the lower bezel in the first terminal region meets a preset condition, and a width of the first connecting terminal is greater than a threshold.

In the display panel of the present application, the first connecting terminal is perpendicular to the lower bezel.

In the display panel of the present application, the first terminal region is positioned in an intermediate region of the lower bezel region.

In the display panel of the present application, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region, the right bezel region, and an edge region of the lower bezel region.

In the display panel of the present application, an included angle between a longitudinal direction of a second connecting terminal and the left bezel in the second terminal region meets a preset condition, and a width of the second connecting terminal is greater than a threshold.

In the display panel of the present application, the first terminal region is positioned in an intermediate region and an edge region of the lower bezel region.

In the display panel of the present application, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region and the right bezel region.

In the display panel of the present application, an included angle between a longitudinal direction of a second connecting terminal and the left bezel in the second terminal region meets a preset condition, and a width of the second connecting terminal is greater than a threshold.

In the display panel of the present application, the left bezel region and the right bezel region are both provided with the second terminal region, in the left bezel region, the second connecting terminal of the second terminal region is connected to a gate driver on array (GOA) circuit, and in the right bezel region, the second connecting terminal of the second terminal region is connected to an antistatic circuit.

In the display panel of the present application, the left bezel region and the right bezel region are both provided with the second terminal region, the second connecting terminals of the second terminal region in the left bezel region and the right bezel region are connected to the GOA circuit.

In the display panel of the present application, a number of the first terminal region is plural, and each of the first terminal regions is equal in width.

In the display panel of the present application, the display panel further includes a driving circuit and a connecting layer, the driving circuit includes a driving chip and a connecting member, one end of the connecting member is connected to the driving chip, another end of the connecting member is provided with a driving terminal, and the driving terminal corresponds to the connecting terminal, and the connecting layer is used to bond the driving terminal and the connecting terminal.

In the display panel of the present application, the connecting member includes a first connecting unit, and the first connecting unit is provided with a first driving terminal, the first connecting unit corresponds to the first terminal region.

In the display panel of the present application, the connecting member includes a second connecting unit, a second driving terminal is disposed in the second connecting unit, and the second connecting unit corresponds to the second terminal region.

The present application also provides a display device, including a display panel, the display panel includes:
 a display region;
 a non-display region, disposed outside the display region, the non-display region including a lower bezel region, and the lower bezel region positioned at a lower end of the display region; and
 a terminal region, the terminal region provided with a connecting terminal, the terminal region including a first terminal region, and the first terminal region positioned in the lower bezel region, wherein an included angle between a longitudinal direction of a first connecting terminal and the lower bezel in the first terminal region meets a preset condition, and a width of the first connecting terminal is greater than a threshold.

In the display device of the present application, the first connecting terminal is perpendicular to the lower bezel.

In the display device of the present application, the first terminal region is positioned in an intermediate region of the lower bezel region.

In the display device of the present application, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region, the right bezel region, and an edge region of the lower bezel region.

In the display device of the present application, the first terminal region is positioned at an intermediate region and an edge region of the lower bezel region.

In the display device of the present application, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region and the right bezel region.

Beneficial Effect

The beneficial effects of the application are:

The present application provides a display panel and a display device. The display panel includes a display region, a non-display region, and a terminal region; the non-display region is disposed outside the display region, and the non-display region includes a lower bezel region positioned at a lower end of the display region; and the terminal region is provided with a connecting terminal, the terminal region includes a first terminal region, and the first terminal region is positioned in the lower bezel region of the display panel, wherein an included angle between a longitudinal direction of the first connecting terminal and the lower bezel in the first terminal region meets a preset condition, and a width of the first connecting terminal is greater than a threshold. The application sets the width of the first connecting terminal that meets the preset condition in the lower bezel area to be greater than the threshold value. Compared with the prior art, on the basis of the same bonding area for the connecting terminal, increasing a width of the connecting terminal makes a length of the connecting terminal reduced, thereby reducing a width of the lower bezel and realizing a narrow bezel.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

The following description of the various embodiments is provided to illustrate the specific embodiments of the invention. Directional terms mentioned in this application, such as "upper", "lower", "front", "behind", "left", "right", "inside", "outside", "side", etc., are only references to the directions of the drawings. Therefore, the directional terminology used is for the purpose of illustrating and understanding the application and is not intended to limit the application. In the drawings, elements having similar structures are denoted by the same reference numerals.

The present application provides a display panel to solve the technical problem that a width of the lower bezel of the current display panel is wider.

Figure 2:
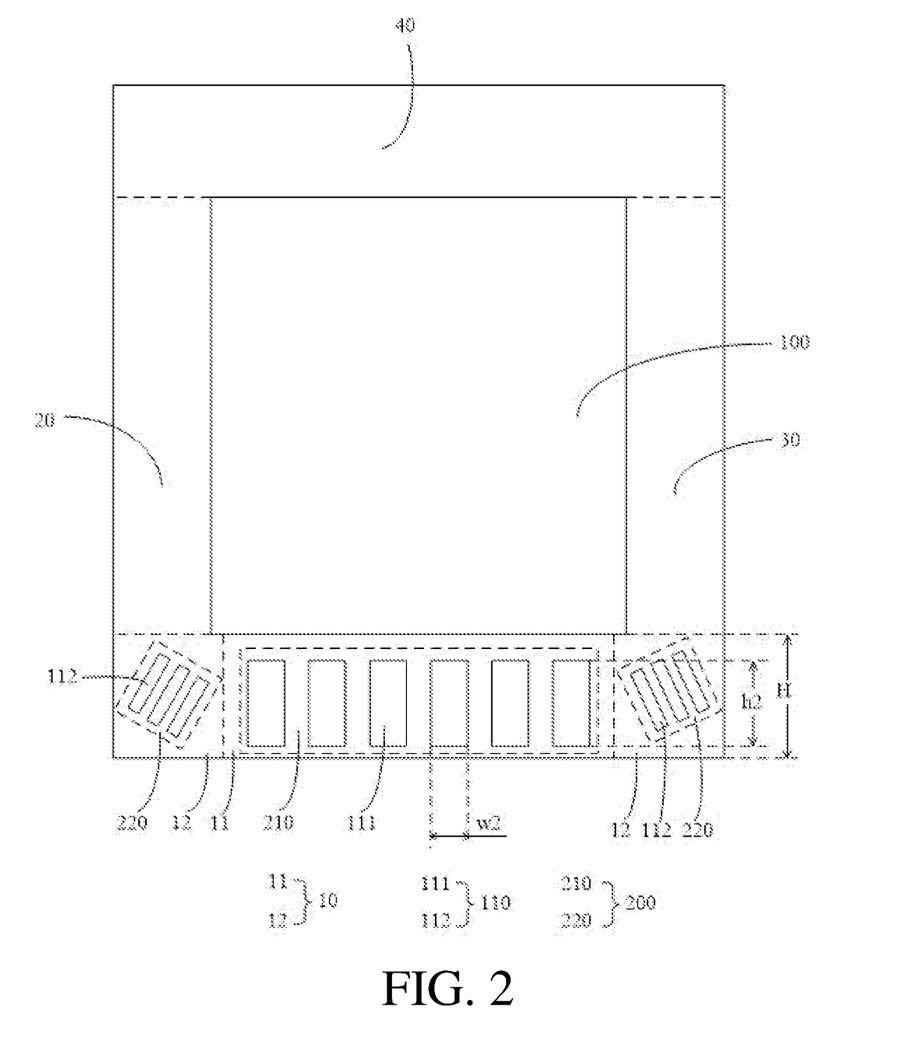
FIG. 2 is a schematic diagram of a first type structure of a display panel according to an embodiment of the present application.

FIG. 2 is a schematic diagram showing a first structure of a display panel provided by an embodiment of the present application. The display panel includes a display region 100, a non-display region, and a terminal region 200. The non-display region is disposed outside the display region 100, and includes a lower bezel region 10 positioned at a lower end of the display region 100.

The terminal region 200 is provided with a connecting terminal 110, the terminal region 200 includes a first terminal region 210, and the first terminal region 200 is positioned at the lower bezel region 10, wherein an included angle between a longitudinal direction of a first connecting terminal 111 and the lower bezel in the first terminal region 200 meets a preset condition, and a width w2 of the first connecting terminal 111 is greater than a threshold.

The center of the display panel is the display region 100, and the remaining part is a non-display region, including a lower bezel region 10, a left bezel region 20, a right bezel region 30, and an upper bezel region 40, wherein the lower bezel region 10 is positioned at a lower end of the display region 100, the left bezel region 20 is positioned at a left end of the display region 100, the right bezel region 30 is positioned at a right end of the display region 100, and the upper bezel region 40 is positioned at an upper end of the display region 100. The lower bezel region 10 includes an intermediate region 11 and an edge region 12 positioned at a left side and a right side of the intermediate region 11, wherein an area of the intermediate region 11 accounts for 60% to 80% of an area of the lower bezel region 10.

A terminal region 200 is disposed in the non-display area, the terminal region 200 is provided with the connecting terminal 110, and the connecting terminal 110 generally has a rectangular structure. Driving circuits are bonded to the connecting terminal 110 to form a display panel.

The first terminal region 200 is positioned in the lower bezel region 10 of the display panel and may be positioned in the intermediate region 11, or positioned in the edge region 12, or positioned both in the intermediate region 11 and the edge region 12. In the embodiment, the first terminal region 200 is positioned in the intermediate region 11 of the lower bezel region 10, and the first terminal region 200 is provided with a first connecting terminal 111, wherein an included angle between a longitudinal direction of the first connecting terminal 111 and the lower bezel meets a preset condition.

In one embodiment, an included angle between the longitudinal direction of the first connecting terminal 111 and the lower bezel is greater than or equal to 45 degrees and less than or equal to 90 degrees. In this embodiment, an included angle between the first connecting terminal 111 and the lower bezel is 90 degrees, that is, the first connecting terminal 111 is perpendicular to the lower bezel.

A length of the first connecting terminal 111 is h2, and the width w2 of the first connecting terminal 111 is greater than the threshold, wherein the threshold is a width of the connecting terminal 110 in the prior art.

Figure 1:
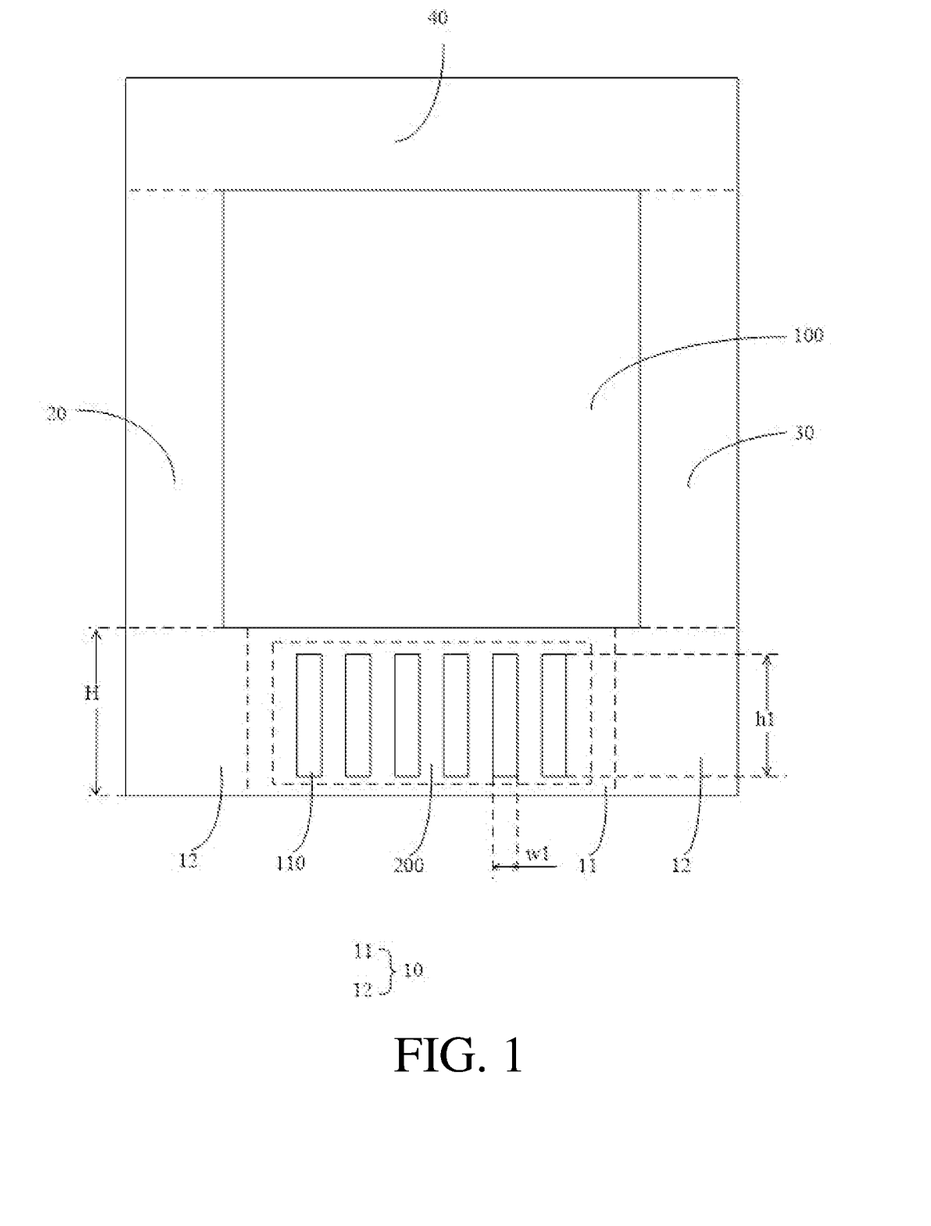
FIG. 1 is a schematic structural view of a display panel in the prior art.

Shown in FIG. 1 is a schematic structural view of a display panel in the prior art. The display panel is only provided with a connecting terminal 110, a region where the connecting terminal 110 is located is called terminal region 200, and the terminal region 200 is located in an intermediate region 11 of a lower bezel region 10. The connecting terminal 110 has a length H and a width w1.

There are multiple signal wires in the display area 100 of the display panel, including data wires, scan wires, antistatic wires, and the like. The various signal wires are led out from the display region 100 and connected to the connecting terminal 110 via a fan-out region (not shown), and a driving circuit is then bonded to the connecting terminal 110 to form the display panel. A driving terminal is also formed in the driving circuit, and the driving terminal is aligned with the connecting terminal 110 one by one. An area of the connecting terminal 110 is the product of the length H and the width w1 of the connecting terminal 110, that is, a bonding area of the driving terminal.

The terminal region 200 is positioned in the intermediate region 11 of the lower bezel region 10, that is, the connecting terminal 110 is only positioned in the intermediate region 11, and the region is limited. Since a number of signal wires of the display panel is greater, a number of the connecting terminals 110 is also greater. However, in order to ensure that the display panel is bonding to the driving circuit with sufficient bonding area, the width w1 of the connecting terminal 110 is designed to be shorter, and a length h1 is designed to be longer, thereby causing the width H of the lower bezel region 10 to be greater, and it is difficult to realize a narrow bezel.

In the present application, a width w2 of the first connecting terminal 111 in the first terminal region 210 is designed to be greater than a threshold value. When ensuring a bonding area is equal to that in the prior art, a length h2 of the first connecting terminal 111 is reduced. Moreover, since the first terminal region 10 is positioned in the lower bezel region 10, a width H of the lower bezel region 10 is also shorter, thereby a narrow bezel is realized.

An included angle between the longitudinal direction of the first connecting terminal 111 and the lower bezel in the first terminal region 10 meets a preset condition. The first connecting terminal 111 may be perpendicular to the lower bezel or may form a certain included angle with the lower bezel. Since a decrease in the width H of the lower bezel region 10 is related to a degree of decrease in the length h2 of the first connecting terminal 111, when the first connecting terminal 111 is perpendicular to the lower bezel, a value of the length h2 of the first connecting terminal 111 is reduced to be equal to a value of the width H of the lower bezel region 10, and an effect of achieving a narrow bezel at this situation is best. When a certain included angle is formed between the longitudinal direction of the first connecting terminal 111 and the lower bezel, the reduced value of the length h2 of the first connecting terminal 111 is less than the reduced value of the width H of the lower bezel region 10. In this situation, the effect of the narrow bezel is also achieved to a certain extent. Of course, In order to ensure that there is enough space for setting the first connecting terminal 111 in the lower bezel region 10 and facilitating subsequent bonding with the driving circuit, an included angle between the longitudinal direction of the first connecting terminal 111 and the lower bezel cannot be too large. In one embodiment, an included angle between the longitudinal direction of the first connecting terminal 111 and the lower bezel ranges from greater than or equal to 45 degrees to less than or equal to 90 degrees.

As shown in FIG. 2, the terminal region 200 further includes a second terminal region 220, and the second terminal region 220 is provided with a second connecting terminal 120. The second terminal region 220 can be positioned in at least one of the left bezel region 20, the right bezel region 30, and the edge region 12 of the lower bezel region 10 of the display panel. In the present embodiment, the second terminal region 220 is positioned in the edge region 12 of the lower bezel region 10, and can be positioned at the edge region 12 of the left side, or at the edge region 12 of the right side, or at the edge region 12 of the left side and the right side.

In one embodiment, the connecting terminal 110 in the display panel includes only the first connecting terminal 111 disposed in the first terminal region 210. In this situation, a width of the first connecting terminal 111 is greater than a threshold, and a width H of the lower bezel region 10 can be reduced.

In one embodiment, since the width of the first connecting terminal 111 is greater than a threshold, the width of the first terminal region 210 is increased relative to the width in the prior art. Therefore, an additional region is required to place the connecting terminals 110, and the redundant connecting terminals 110 are the second connecting terminals 112 in the second terminal region 220.

An included angle between the longitudinal direction of the second connecting terminal 112 in the second terminal region 220 and the left bezel meets a preset condition, and a width of the second connecting terminal 112 is greater than a threshold.

Since the second terminal region 220 is positioned in the edge region 12 of the lower bezel region 10, the space of the edge region 12 is small. In order to ensure that more second connecting terminals 112 are accommodated in the edge region 12, a longitudinal direction of the second connecting terminal 112 has a certain included angle with the left bezel or the right bezel, that is, the second connecting terminal 112 is inclinedly disposed with respect to the lower bezel. In one embodiment, the included angle ranges from greater than 45 degrees to less than or equal to 90 degrees.

At the same time, the width of the second connecting terminal 112 is greater than a threshold, that is, the length becomes shorter, and interacting with the first connecting terminal 111, the width H of the lower bezel region 10 can be narrowed. The threshold can be designed as needed by a person skilled in the art, and the threshold is as large as possible on the premise that the edge region 12 can accommodate the second connecting terminal 112.

In one embodiment, the left bezel region 20 of the display panel is provided with a gate driver on array (GOA) circuit, and the right bezel region 30 is provided with an anti-static circuit. Since the edge region 12 is closer to the left bezel region 20 and the right bezel region 30, in the edge region 12 of the left side, the second connecting terminal 112 in the second terminal region 220 is connected to the GOA circuit, and in the edge region 12 of the right side, the second connecting terminal 112 in the second terminal region 220 is connected to the antistatic circuit.

In one embodiment, both the left bezel region 20 and the right bezel region 30 of the display panel are provided with the GOA circuit. In this situation, in the edge region 12 of the left side and the right side, all the second connecting terminals 112 of the second terminal region 220 are connected to the GOA circuit.

Figure 3:
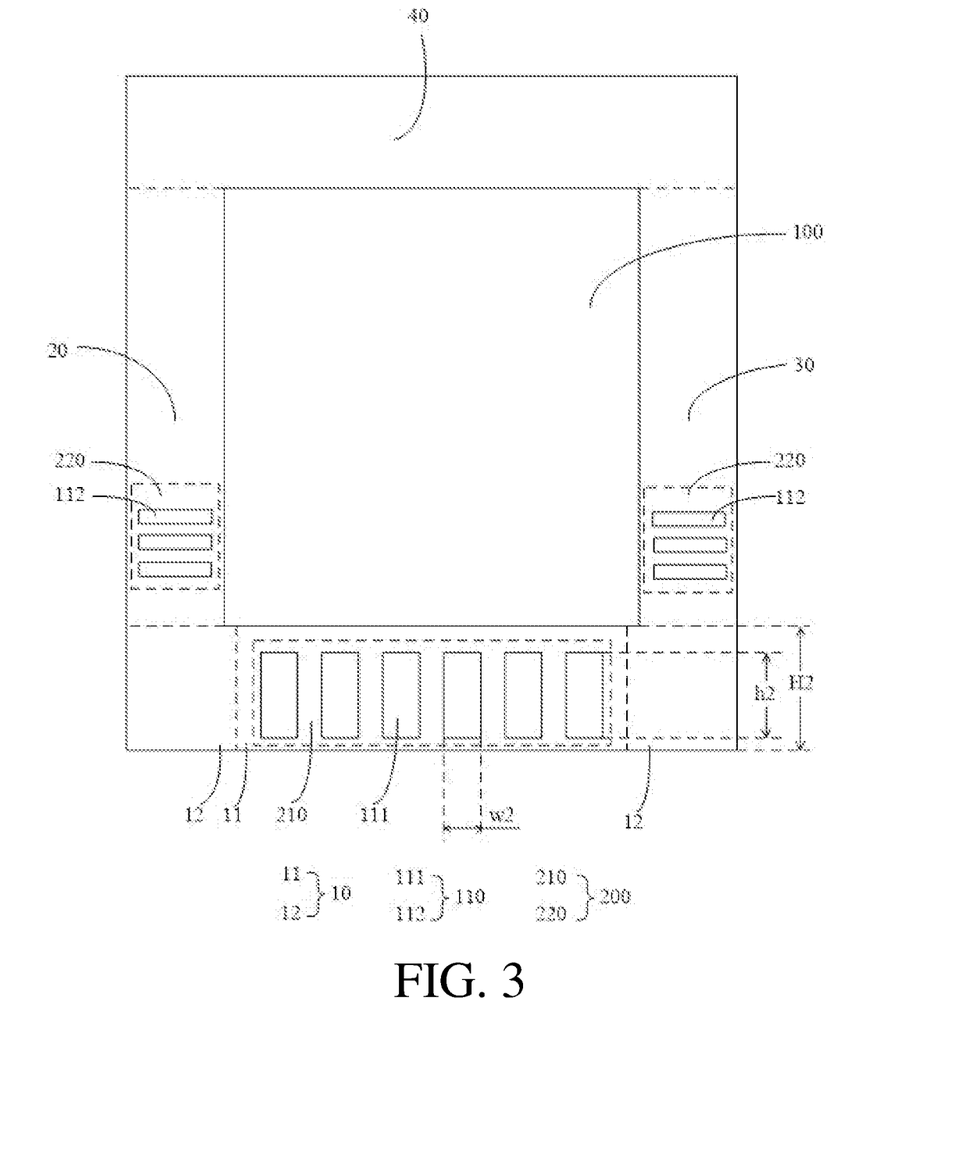
FIG. 3 is a schematic diagram of a second type structure of a display panel according to an embodiment of the present application.

Shown in FIG. 3 is a schematic diagram showing a second type structure of a display panel provided by an embodiment of the present application. The difference from the structure in FIG. 2 is that the second terminal region 220 is positioned in the left bezel region 20 and the right bezel 30.

The included angle between the longitudinal direction of the second connecting terminal 112 in the second terminal region 220 and the left bezel meets a preset condition, and the width of the second connecting terminal 112 is greater than a threshold.

The longitudinal direction of the second connecting terminal 112 has a certain included angle with the left bezel or the right bezel, that is, the second connecting terminal 112 is inclinedly disposed with respect to the lower bezel. In one embodiment, the included angle ranges from greater than or equal to 45 degrees to less than or equal to 90 degrees. In this embodiment, the second connecting terminal 112 is perpendicular to the left bezel or the right bezel, that is, the included angle between the longitudinal direction of the second connecting terminal 112 and the left bezel or the right bezel is 90 degrees. When the driving terminal of the subsequent driving circuit is bonding to the connecting terminal 110, a portion of the driving terminal is bonding to the first connecting terminal 111 in the lower bezel region 10, and the other portion of the driving terminal is bonding to the second connecting terminal 112 in the left bezel region 20 and the right bezel region 30.

At the same time, a width of the second connecting terminal 112 is greater than a threshold, that is, the length becomes shorter. Since compared with the prior art, the second connecting terminal 112 is disposed on the left bezel region 20 and the right bezel region 30, setting the width of the second connecting terminal 112 to be greater than the threshold to reduce the length thereof can ensure that the widths of the left bezel region 20 and the right bezel region 30 are narrow. Interacting with the first connecting terminal 111 can ensure that the widths of the upper, lower, left and right sides of the display panel are kept uniform, thereby achieving a better full screen effect. The threshold can be designed as needed by a person skilled in the art, and the threshold is as large as possible on the premise that the left bezel region 20 and the right bezel region 30 can accommodate the second connecting terminal 112 and facilitate the bonding of the driving circuit.

In one embodiment, a gate driver on array (GOA) circuit is disposed on both the left bezel region 20 and the right bezel region 30 of the display panel. At this time, in the left bezel region 20 and the right bezel region 30, the second connecting terminals 112 of the second terminal region 220 are all connected to the GOA circuit.

Figure 4:
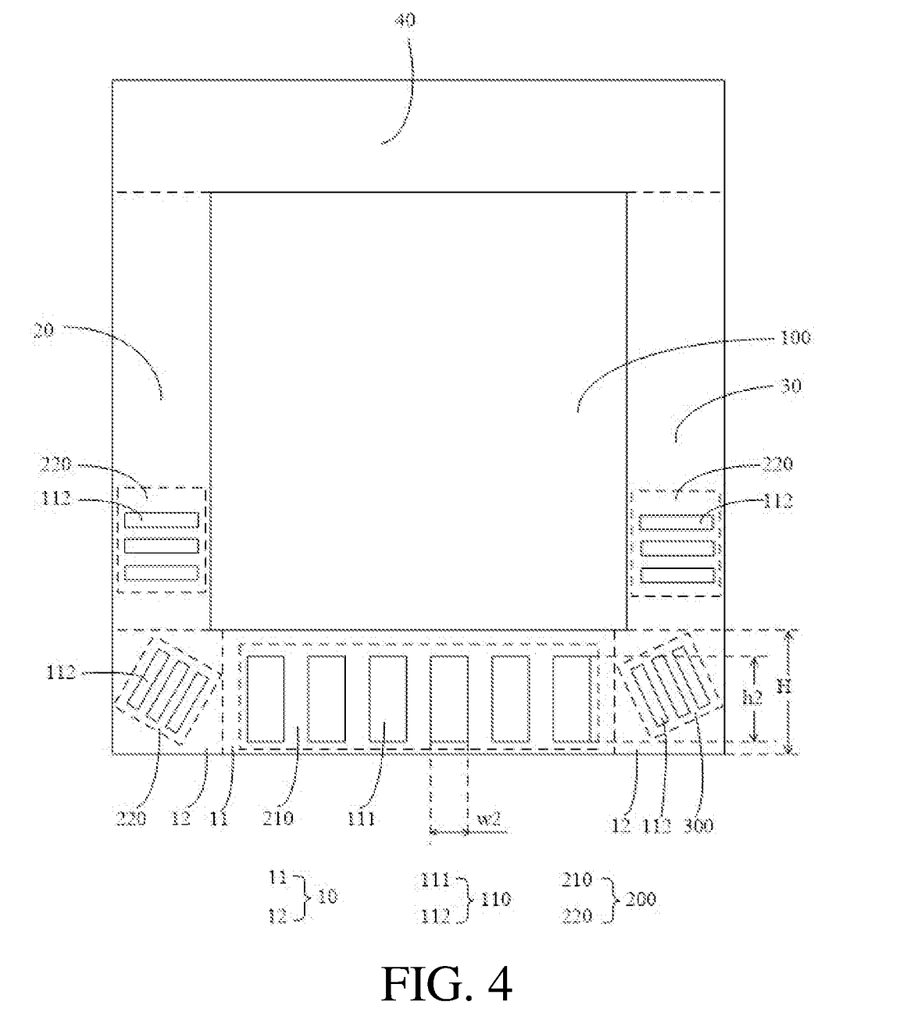
FIG. 4 is a schematic diagram of a third type structure of a display panel according to an embodiment of the present application.

Shown in FIG. 4 is a third type schematic structural diagram of a display panel provided by an embodiment of the present application. The difference from the structures in FIG. 2 and FIG. 3 is that in the present embodiment, the second terminal region 220 is disposed in the edge region 12 of the left bezel region 20, the right bezel region 30, and the lower bezel region 10.

In one embodiment, the left bezel region 20 of the display panel is provided with a GOA circuit, and the right bezel region 30 is provided with an anti-static circuit. In this situation, in the left bezel region 20 and a left side of the edge region 12, the second connecting terminal 112 of the second terminal region 220 is connected to the GOA circuit, and in the right bezel region 30 and a right side of the edge region 12, the second connecting terminal 112 of the second terminal region 220 is connected to the anti-static circuit.

In one embodiment, a GOA circuit is disposed in the left bezel region 20 and the right bezel region 30 of the display panel. In this situation, in the left bezel region 20, the right bezel region 30, and the left and right sides of the edge region 12, the second connecting terminals 112 of the second terminal region 220 are all connected to the GOA circuit.

By setting the width of the first connecting terminal 111 to be greater than the threshold value, when ensuring the same bonding area as in the prior art, the length h2 of the first connecting terminal 111 is reduced, thus causing the width H of the lower bezel region 10 to be shorter. By setting the width of the second connecting terminal 112 to be greater than the threshold value, this ensures that the widths of the left side and the right side of the bezel are narrow, and further ensures that the widths of the upper, the lower, the left and the right sides of the display panel are kept uniform, thereby achieving a better full screen effect.

Figure 5:
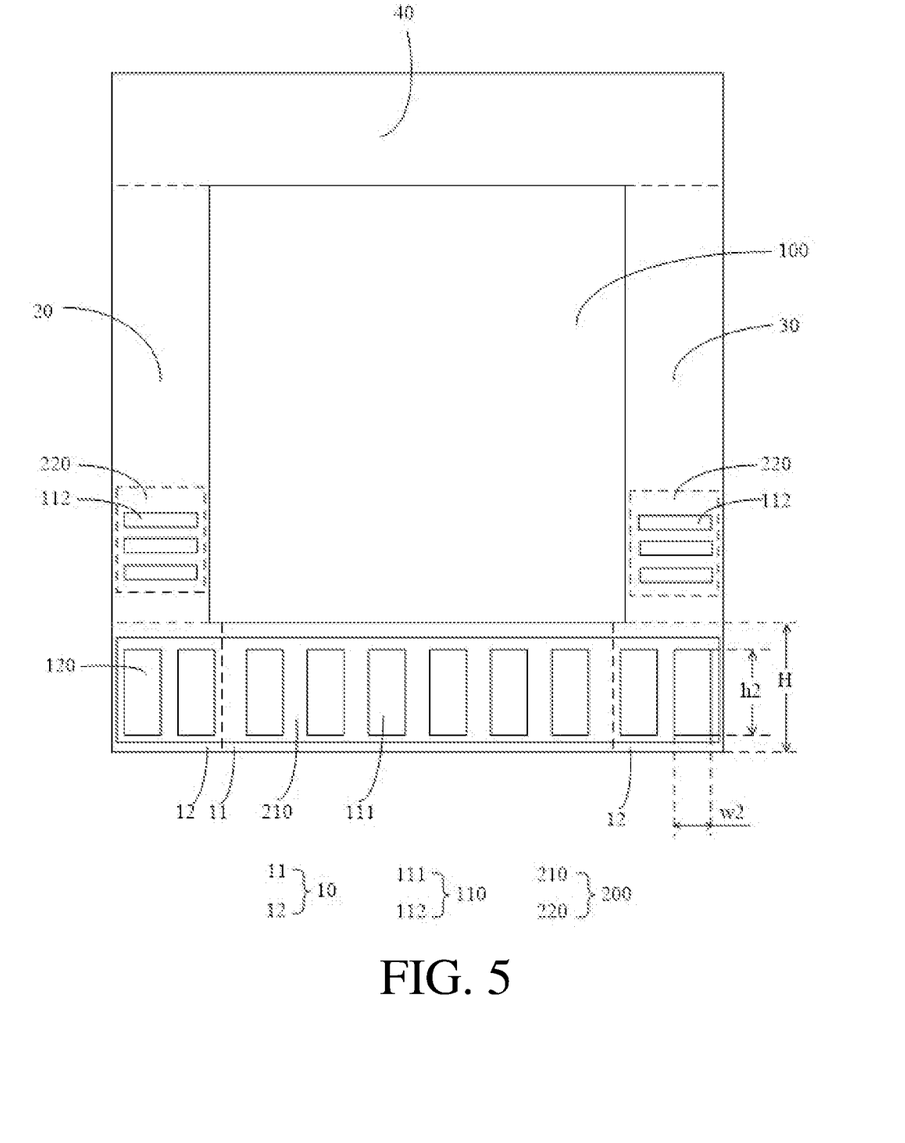
FIG. 5 is a schematic diagram of a fourth type structure of a display panel according to an embodiment of the present application.

FIG. 5 is a schematic diagram showing a fourth type structure of a display panel provided by an embodiment of the present application. In the present embodiment, the first terminal region 210 is positioned in the intermediate region 11 and the edge region 12 of the lower bezel region 10.

In this embodiment, the width w2 of the first connecting terminal 111 is designed to be greater than the threshold value, and when ensuring the same bonding area as in the prior art, the length h2 of the first connecting terminal 111 is reduced. Moreover, since the first terminal region 210 is positioned in the lower bezel region 10, the width H of the lower bezel region 10 is also shorter, and thereby a narrow bezel is realized.

The included angle between the longitudinal direction of the first connecting terminal 111 and the lower bezel in the first terminal region 10 meets a preset condition, and the first connecting terminal 111 can be perpendicular to the lower bezel or at a certain angle to the lower bezel. Since the decrease in the width H of the lower bezel region 10 is related to the degree of decrease in the length h2 of the first connecting terminal 111, when the first connecting terminal 111 is perpendicular to the lower bezel, a value of the length h2 of the first connecting terminal 111 is reduced to be equal to a value of the width H of the lower bezel region 10, and an effect of achieving a narrow bezel at this situation is best. When a certain included angle is formed between the longitudinal direction of the first connecting terminal 111 and the lower bezel, the reduced value of the length h2 of the first connecting terminal 111 is less than the reduced value of the width H of the lower bezel region 10. In this situation, the effect of the narrow bezel is also achieved to a certain extent. Of course, in order to ensure that there is enough space for setting the first connecting terminal 110 in the lower bezel region 10 and facilitating subsequent bonding with the driving circuit, an included angle between the longitudinal direction of the first connecting terminal 111 and the lower bezel cannot be too large. In one embodiment, an included angle between the longitudinal direction of the first connecting terminal 111 and the lower bezel ranges from greater than or equal to 60 degrees to less than or equal to 90 degrees.

In one embodiment, the connecting terminal 110 in the display panel includes only the first connecting terminal 111 disposed on the first terminal region 210. In this situation, a width of the first connecting terminal 111 is greater than a threshold, and a width H of the lower bezel region 10 can be reduced.

In one embodiment, since the width of the first connecting terminal 111 is greater than a threshold, the width of the first terminal region 210 is increased relative to the width in the prior art. Therefore, an additional region is required to place the connecting terminals 110, and the redundant connecting terminals 110 are the second connecting terminals 112 in the second terminal region 220.

An included angle between the longitudinal direction of the second connecting terminal 112 in the second terminal region 220 and the left bezel meets a preset condition, and a width of the second connecting terminal 112 is greater than a threshold. The included angle ranges from greater than 45 degrees to less than or equal to 90 degrees.

At the same time, a width of the second connecting terminal 112 is greater than a threshold, that is, the length becomes shorter. Since compared with the prior art, the second connecting terminal 112 is disposed on the left bezel region 20 and the right bezel region 30, setting the width of the second connecting terminal 112 to be greater than the threshold to reduce the length thereof can ensure that the widths of the left bezel region 20 and the right bezel region 30 are narrow. Interacting with the first connecting terminal 111 can ensure that the widths of the upper, lower, left and right sides of the display panel are kept uniform, thereby achieving a better full screen effect. The threshold can be designed as needed by a person skilled in the art, and the threshold is as large as possible on the premise that the left bezel region 20 and the right bezel region 30 can accommodate the second connecting terminal 112 and facilitate the bonding of the driving circuit.

By setting the width of the first connecting terminal 111 to be greater than the threshold value, when ensuring the same bonding area as in the prior art, the length h2 of the first connecting terminal 111 is reduced, thus causing the width H of the lower bezel region 10 to be shorter. By setting the width of the second connecting terminal 112 to be greater than the threshold value, this ensures that the widths of the left side and the right side of the bezel are narrow, and further ensures that the widths of the upper, the lower, the left, and the right sides of the display panel are kept uniform, thereby achieving a better full screen effect.

Figure 6:
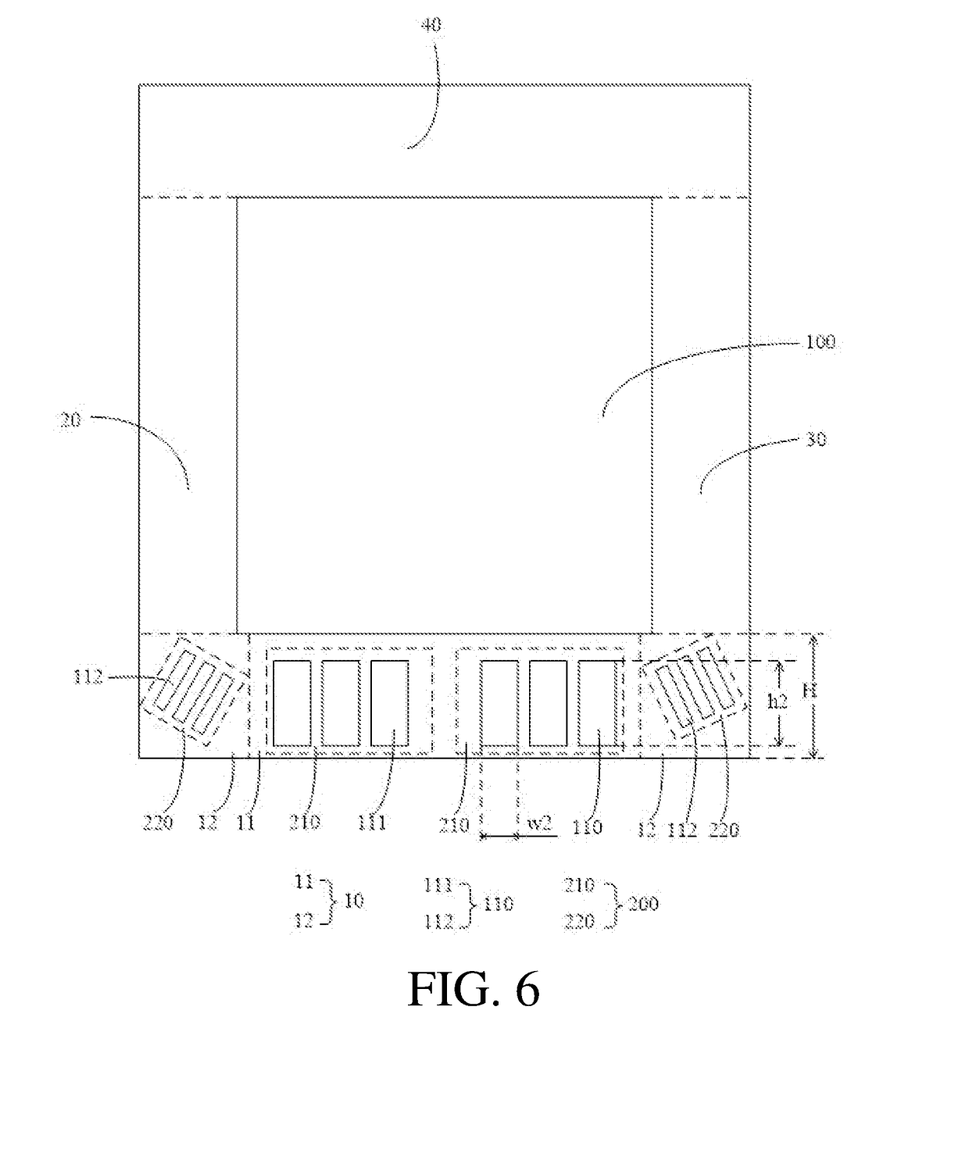
FIG. 6 is a schematic diagram of a fifth type structure of a display panel according to an embodiment of the present application.

Shown in FIG. 6 is a schematic diagram showing a fifth type structure of a display panel provided by an embodiment of the present application. The difference from the structure in FIG. 2 is that a plurality of first terminal regions 210 is included in this embodiment.

The widths of the plurality of first terminal regions 210 may be the same or different. The first connecting terminals 111 may be equally spaced in each of the first terminal regions 210, and the adjacent first terminal regions 210 are separated by a certain distance.

The plurality of first terminal regions 210 can be disposed only in the intermediate region 11 of the lower bezel region 10, and they can also be simultaneously disposed in the intermediate region 11 and the edge region 12, and the spacing between the first terminal regions 210 can be designed as needed. The second terminal region 220 is disposed in the same manner as in the above embodiment, and details are not described herein again.

When subsequently bonding to a driving circuit, the driving circuit includes a driving chip and a connecting member. One end of the connecting member is connected to the driving chip, and the other end of the connecting member is provided with a driving terminal, and the driving terminal corresponds to the connecting terminal.

The driving circuit includes a plurality of connecting units, each of the connecting units is bonded to one terminal region 200, that is, the driving circuit and the display panel are connected in multiple stages. In the prior art, as shown in FIG. 1, only one terminal region 200 is provided, that is, the driving circuit and the connecting terminal 110 are connected in one stage. Compared with the one-stage connection of the driving circuit and the connecting terminal 110, the multi-stage connection is more advantageous for the connecting member to be bent to the back of the display panel, thereby realizing a narrow bezel.

Figure 7:
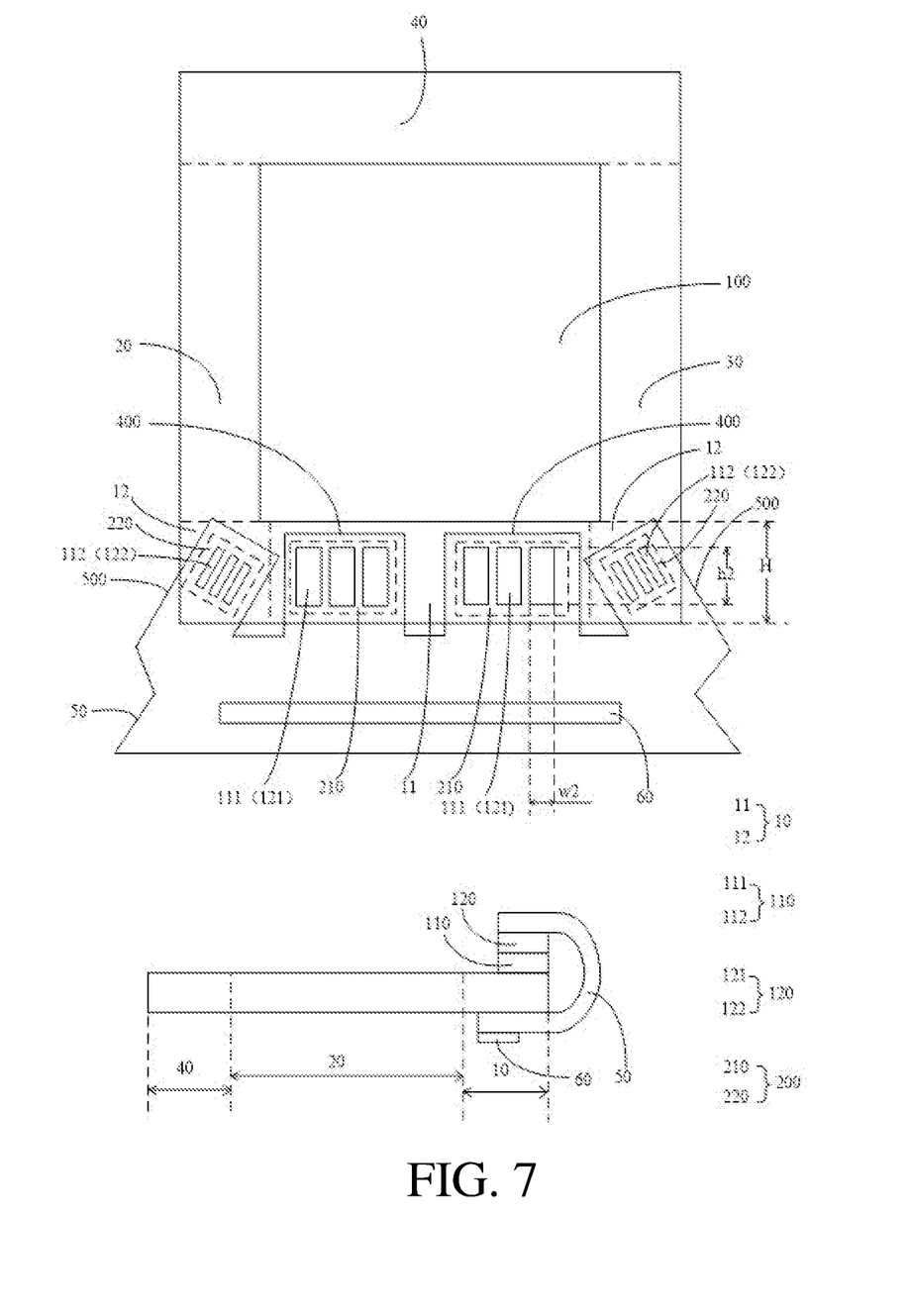
FIG. 7 is a structural diagram of a sixth type display panel according to an embodiment of the present disclosure.

In one embodiment, the display panel further includes a driving circuit and a connecting layer. FIG. 7 is a sixth type structural diagram of a display panel according to an embodiment of the present application, including a front view and a side view. The front view shows the state when the drive circuit is unfolded, and the side view shows the state when the drive circuit is bent.

The driving circuit includes a driving chip 60 and a connecting member 50. One end of the connecting member 50 is connected to the driving chip 60, and the other end of the connecting member 50 is provided with a driving terminal 120, and the driving terminal 120 corresponds to the connecting terminal 110.

The connecting layer is used to bond the driving terminal 120 and the connecting terminal 110.

The center of the display panel is the display region 100, and the remaining part is a non-display region, including a lower bezel region 10, a left bezel region 20, a right bezel region 30, and an upper bezel region 40, wherein the lower bezel region 10 is positioned at a lower end of the display region 100, the left bezel region 20 is positioned at a left end of the display region 100, the right bezel region 30 is positioned at a right end of the display region 100, and the upper bezel region 40 is positioned at an upper end of the display region 100. The lower bezel region 10 includes an intermediate region 11 and an edge region 12 positioned at a left side and a right side of the intermediate region 11, wherein an area of the intermediate region 11 accounts for 60% to 80% of an area of the lower bezel region 10.

A terminal region 200 is disposed in the non-display area, the terminal region 200 is provided with a connecting terminal 110, the connecting terminal 110 generally has a rectangular structure. The driving circuits are bonded to the connecting terminal 110.

The first terminal region 200 is positioned in the lower bezel region 10 of the display panel and may be positioned in the intermediate region 11, or positioned in the edge region 12, or positioned both in the intermediate region 11 and the edge region 12. In the embodiment, the first terminal region 200 is positioned in the intermediate region 11 of the lower bezel region 10, and the first terminal region 200 is provided with a first connecting terminal 111, wherein an included angle between a longitudinal direction of the first connecting terminal 111 and the lower bezel meets a preset condition.

In one embodiment, an included angle between the longitudinal direction of the first connecting terminal 111 and the lower bezel is greater than or equal to 45 degrees and less than or equal to 90 degrees. In this embodiment, an included angle between the first connecting terminal 111 and the lower bezel is 90 degrees, that is, the first connecting terminal 111 is perpendicular to the lower bezel.

A length of the first connecting terminal 111 is h2, and a width w2 of the first connecting terminal 111 is greater than a threshold, the threshold is a width of the connecting terminal 110 in the prior art.

In the present application, a width w2 of the first connecting terminal 111 in the first terminal region 10 is designed to be greater than a threshold value. When ensuring a bonding area is equal to that in the prior art, a length h2 of the first connecting terminal 111 is reduced. Moreover, since the first terminal region 210 is positioned in the lower bezel region 10, a width H of the lower bezel region 10 is also shorter, thereby a narrow bezel is realized.

The connecting member 50 is a chip-on-film. When the driving circuit is bonded to the connecting terminal 110, one end of the chip-on-film is bonded to the connecting terminal 110 by the driving terminal 120, and the other end is connected to the driving chip 60 and bent to the back surface, and the electrical signal of the driving chip 60 is transmitted to the connecting terminal 110 in the display panel to drive the display panel. The driving terminals 120 are in one-to-one correspondence with the connecting terminals 110.

The material of the connecting layer is an anisotropic conductive adhesive, and the anisotropic conductive adhesive can realize an electrical connection between the connecting terminal 110 and the driving terminal 120.

The connecting member 50 includes a first connecting unit 400, the first connecting unit 400 is provided with a first driving terminal 121, and the first connecting unit 400 corresponds to the first terminal region 210.

In one embodiment, the display panel is provided with only one first terminal region 210, the connecting member 50 is also provided with only one first connecting unit 400. The first driving terminals 121 in the first connecting unit 400 are bonded to the first connecting terminals 111 in the first terminal region 210 in one-to-one correspondence.

In one embodiment, the display panel is provided with a plurality of first terminal regions 210. The widths of the plurality of terminal regions 210 can be equal or unequal, and the plurality of terminal regions can be disposed at equal intervals or unequal intervals. In this situation, the connecting member 50 includes a plurality of first connecting units 400, and the first driving terminals 121 of the first connecting units 400 are bonded to the first connecting terminals 111 of the first terminal regions 210 in one-to-one correspondence. When a connecting member 50 is bent to the back surface of the display panel, the connecting member 50 and the connecting terminal 110 are connected in multiple stages, so that the bending effect of the connecting member 50 is better, and the width of the lower bezel of the display panel is shorter, which is advantageous for achieving a narrow bezel.

Since the width of the first connecting terminal 111 in the first terminal region 210 is greater than the threshold, the width of the entire first terminal region 210 is increased, and the connecting terminal 110 requires more regions to be placed. In one embodiment, the terminal region 200 further includes a second terminal region 220, the second terminal region 220 is provided with the second connecting terminal 120. The second terminal region 220 can be positioned in at least one of the left bezel region 20, the right bezel region 30, and the edge region 12 of the lower bezel region 10 of the display panel. In the present embodiment, the second terminal region 220 is positioned in the edge region 12 of the lower bezel region 10, and can be positioned at the edge region 12 of the left side, or at the edge region 12 of the right side, or at the edge region 12 of the left side and the right side.

An included angle between the longitudinal direction of the second connecting terminal 112 in the second terminal region 220 and the left bezel meets a preset condition, and a width of the second connecting terminal 112 is greater than a threshold. The included angle ranges from greater than 45 degrees to less than or equal to 90 degrees.

Since the second terminal region 220 is positioned in the edge region 12 of the lower bezel region 10, and the space of the edge region 12 is small, in order to ensure that more second connecting terminals 112 are accommodated in the edge region 12, a longitudinal direction of the second connecting terminal 112 has a certain included angle with the left bezel or the right bezel, that is, the second connecting terminal 112 is inclinedly disposed with respect to the lower bezel. In one embodiment, the included angle ranges from greater than 45 degrees to less than or equal to 90 degrees.

At the same time, the width of the second connecting terminal 112 is greater than a threshold, that is, the length becomes shorter, and interacting with the first connecting terminal 111, the width H of the lower bezel region 10 can be narrowed. The threshold can be designed as needed by a person skilled in the art, and the threshold is as large as possible on the premise that the edge region 12 can accommodate the second connecting terminal 112.

In one embodiment, the left bezel region 20 of the display panel is provided with a GOA circuit, and the right bezel region 30 is provided with an anti-static circuit. Since the edge region 12 is closer to the left bezel region 20 and the right bezel region 30, in the edge region 12 of the left side, the second connecting terminal 112 in the second terminal region 220 is connected to the GOA circuit, and in the edge region 12 of the right side, the second connecting terminal 112 in the second terminal region 220 is connected to the antistatic circuit.

In one embodiment, both the left bezel region 20 and the right bezel region 30 of the display panel are provided with the GOA circuit. In this situation, in the edge region 12 of the left side and the right side, all the second connecting terminals 112 of the second terminal region 220 are connected to the GOA circuit.

Correspondingly, the connecting member 50 includes a second connecting unit 500, and the second connecting unit 500 is provided with a second driving terminal 122, and the second connecting unit 500 corresponds to the second terminal region 220.

In this situation, the connecting member 50 includes the first connecting unit 400 and the second connecting unit 500. The first driving terminal 121 of the first connecting unit 400 is bonded to the first connecting terminal 111 of the first terminal region 210 in one-to-one correspondence, and the second driving terminals 122 of the second connecting unit 500 are bonded to the second connecting terminals 112 of the second terminal region 220 in one-to-one correspondence.

When the second terminal region 220 is positioned in the edge region 12, the fan-out region metal traces of the portions on the left and right sides of the lower bezel of the display panel are disposed at an oblique angle (between 0 and 90 degrees) with the intermediate display region 100 at the corner position of the lower bezel. Correspondingly, the second terminal region 220 corresponding to the position is disposed at an oblique angle on the corners of the lower bezel, and the corresponding connecting member 50 adopts a multi-stage design, and is disposed at an angle between the two sides, and then bonded to the corresponding terminal region 200 by an anisotropic conductive adhesive.

When a connecting member 50 is bent to the back surface of the display panel, the connecting member 50 and a connecting terminal 110 are connected in multiple stages, so that the bending effect of the connecting member 50 is better, and the width of the lower bezel of the display panel is shorter, which is advantageous for achieving a narrow bezel.

In this embodiment, the width of the first connecting terminal 111 in the first terminal region 210 is designed to be greater than a threshold value. When ensuring a bonding area is equal to that in the prior art, a length h2 of the first connecting terminal 111 is reduced. Moreover, since the first terminal region 210 is positioned in the lower bezel region 10, a width H of the lower bezel region 10 is also shorter, thereby a narrow bezel is realized.

At the same time, the included angle between the longitudinal direction of the second connecting terminal 112 of the second terminal region 220 and the left bezel in the edge region 12 meets a preset condition, the width of the second connecting terminal 112 is greater than a threshold, and the length of the second connecting terminal 112 is also reduced. The interaction of the first connecting terminal 111 and the second connecting terminal 112 makes the lower bezel of the display panel narrow.

Figure 8:
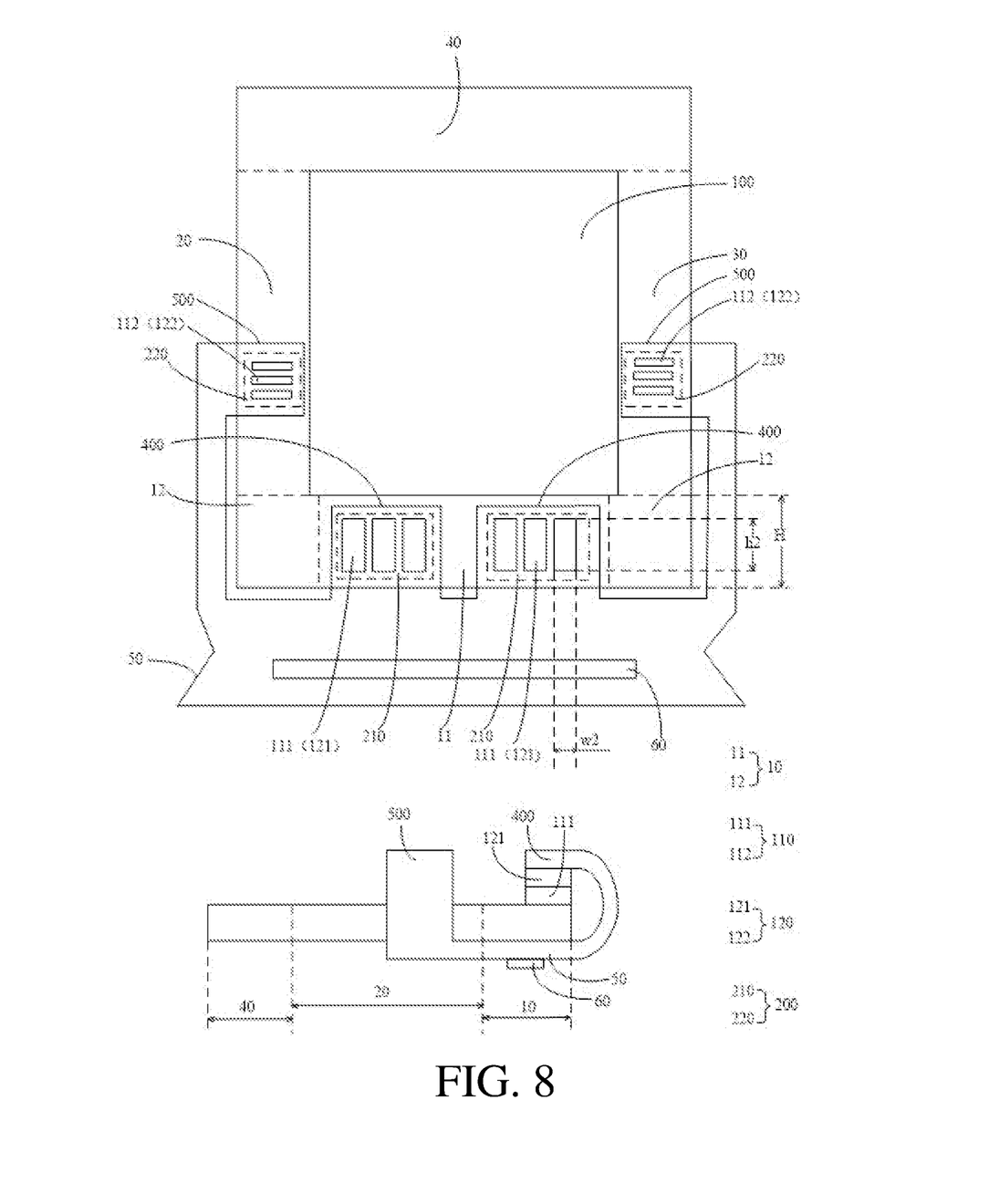
FIG. 8 is a structural diagram of a seventh type display panel according to an embodiment of the present disclosure.

FIG. 8 is a seventh type structural diagram of a display panel according to an embodiment of the present application, including a front view and a side view. The front view shows the state when the drive circuit is unfolded, and the side view shows the state when the drive circuit is bent.

In this embodiment, the second terminal region 220 is disposed in the left and right bezel regions. It can be disposed only in the left bezel region 20, or only in the right bezel region 30, or in the left bezel region 20 and the right bezel region 30.

In one embodiment, the left bezel region 20 of the display panel is provided with a GOA circuit, and the right bezel region 30 is provided with an anti-static circuit. In this situation, in the left bezel region 20 and a left side of the edge region 12, the second connecting terminal 112 of the second terminal region 220 is connected to the GOA circuit, and in the right bezel region 30 and a right side of the edge region 12, the second connecting terminal 112 of the second terminal region 220 is connected to the anti-static circuit.

In one embodiment, a GOA circuit is disposed in the left bezel region 20 and the right bezel region 30 of the display panel. In this situation, in the left bezel region 20, the right bezel region 30, and the left and right sides of the edge region 12, the second connecting terminals 112 of the second terminal region 220 are all connected to the GOA circuit.

An included angle between the longitudinal direction of the second connecting terminal 112 in the second terminal region 220 and the left bezel meets a preset condition. In one embodiment, the angle ranges from greater than 45 degrees to less than or equal to 90 degrees. The width of the second connecting terminal 112 is greater than the threshold value, which ensures that the widths of the left side and the right side of the bezel are narrow, and further ensures that the widths of the upper, the lower, the left, and the right sides of the display panel are kept uniform, thereby achieving a better full screen effect.

The first terminal region 210 can be disposed in the intermediate region 11 of the lower bezel region 10 or can be simultaneously disposed in the intermediate region 11 and the edge region 12 of the lower bezel region 10.

In one embodiment, the first terminal region 210 can be disposed in the intermediate region 11 of the lower bezel region 10, the width w2 of the first connecting terminal 111 is greater than a threshold, the length h2 is reduced, and the width of the lower bezel region 10 is reduced, thereby, a narrow bezel is achieved.

In one embodiment, the first terminal region 210 is simultaneously disposed in the intermediate region 11 and the edge region 12 of the lower bezel region 10. The width of the region where the first connecting terminal 111 is positioned is greater, the width w2 of the first connecting terminal 111 can also be designed to be wider, the length h2 is designed to be shorter, and the width of the lower bezel region 10 is further reduced, thereby achieving a narrow bezel.

In one embodiment, only one first terminal region 210 is disposed in the display panel. In this situation, the connecting member 50 is also provided with only one first connecting unit 400, the first driving terminals 121 in the first connecting unit 400 are bonded to the first connecting terminals 111 in the first terminal region 210 in one-to-one correspondence.

When the connecting member 50 is bent, the first connecting unit 400 is perpendicular to the lower bezel region 10 and is correspondingly bonded to the first terminal region 210. The second connecting unit 500 and the lower bezel region 10 are inclined at a certain angle and are correspondingly bonded to the second terminal region 220. The connecting member 50 and the connecting terminal 110 are connected in multiple stages, such that the bending effect of the connecting member 50 is better, and the width of the lower bezel of the display panel is shorter, which is advantageous for achieving a narrow bezel.

In one embodiment, the display panel is provided with a plurality of first terminal regions 210. The widths of the plurality of terminal regions 210 can be equal or unequal, and the plurality of terminal regions can be disposed at equal intervals or unequal intervals. In this situation, the connecting member 50 includes a plurality of first connecting units 400, and the first driving terminals 121 of the first connecting units 400 are bonded to the first connecting terminals 111 of the first terminal regions 210 in one-to-one correspondence.

When the connecting member 50 is bent, the plurality of first connecting units 400 are perpendicular to the lower bezel region 10 and are correspondingly bonded to the plurality of first terminal regions 210. The second connecting unit 500 is perpendicular to the left bezel region 20 and the right bezel region 30 or at a certain inclination angle and is correspondingly bonded to the second terminal region 220. The connecting member 50 and the connecting terminal 110 are connected in multiple stages so that the bending effect of the connecting member 50 is better, and the width at the lower bezel of the display panel is shorter, which is advantageous for realizing a narrow bezel.

Of course, the manner of setting the first terminal region 210 and the second terminal region 220 is not limited thereto, and there are other ways. For the specific setting manner and setting principle, please refer to the structures shown in FIG. 2 to FIG. 6. By the interaction of the first terminal region 210 and the second terminal region 220, the width of the lower bezel region 10 of the display panel is reduced, and a narrow bezel is realized.

The present application also provides a display device including a display panel. The display panel includes:

a display region;

a non-display region disposed outside the display region, the non-display region includes a lower bezel region, and the lower bezel region positioned at a lower end of the display region; and a terminal region, the terminal region provided with a connecting terminal, the terminal region includes a first terminal region, and the first terminal region positioned in the lower bezel region, wherein an included angle between a longitudinal direction of a first connecting terminal and the lower bezel in the first terminal region meets a preset condition, and a width of the first connecting terminal is greater than a threshold.

In one embodiment, the first connecting terminal is perpendicular to the lower bezel.

In one embodiment, the first terminal region is positioned in an intermediate region of the lower bezel region.

In one embodiment, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region, the right bezel region, and an edge region of the lower bezel region.

In one embodiment, the first terminal region is positioned in an intermediate region and an edge region of the lower bezel region.

In one embodiment, the non-display region further includes a left bezel region and a right bezel region, the left bezel region is disposed at a left end of the display region, and the right bezel region is disposed at a right end of the display region, and the terminal region further includes a second terminal region, the second terminal region is positioned in at least one of the left bezel region and the right bezel region.

In one embodiment, an included angle between a longitudinal direction of a second connecting terminal and the left bezel in the second terminal region meets a preset condition, and a width of the second connecting terminal is greater than a threshold.

In one embodiment, the left bezel region and the right bezel region are both provided with the second terminal region, in the left bezel region, the second connecting terminal of the second terminal region is connected to a GOA circuit, and in the right bezel region, the second connecting terminal of the second terminal region is connected to an antistatic circuit.

In one embodiment, the left bezel region and the right bezel region are both provided with the second terminal region, the second connecting terminals of the second terminal region in the left bezel region and the right bezel region are all connected to the GOA circuit.

In one embodiment, a number of the first terminal region is plural, and each of the first terminal regions is equal in width.

In one embodiment, the display panel further includes a driving circuit and a connecting layer, the driving circuit includes a driving chip and a connecting member, one end of the connecting member is connected to the driving chip, another end of the connecting member is provided with a driving terminal, and the driving terminal corresponds to the connecting terminal, and the connecting layer is used to bond the driving terminal and the connecting terminal.

In one embodiment, the connecting member includes a first connecting unit, and the first connecting unit is provided with a first driving terminal, the first connecting unit corresponds to the first terminal region.

In one embodiment, the connecting member includes a second connecting unit, a second driving terminal is disposed in the second connecting unit, and the second connecting unit corresponds to the second terminal region.

According to the above embodiments, it can be known that: The present application provides a display panel and a display device. The display panel includes a display region, a non-display region, and a terminal region; the non-display region is disposed outside the display region, and the non-display region includes a lower bezel region positioned at a lower end of the display region. The terminal region is provided with a connecting terminal, the terminal region includes a first terminal region, the first terminal region is positioned at a lower bezel region of the display panel, and an included angle between the longitudinal direction of the first connecting terminal and the lower bezel in the first terminal region meets a preset condition, and the width of the first connecting terminal is greater than a threshold. The application sets a width of the first connecting terminal that meets the preset condition in the lower bezel area to be greater than a threshold value. Compared with the prior art, on the basis of the same bonding area for the connecting terminal, increasing a width of the connecting terminal makes a length of the connecting terminal reduced, thereby reducing a width of the lower bezel and realizing a narrow bezel.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A display panel, comprising:
    a display region;
    a non-display region disposed outside the display region, wherein the non-display region comprises a lower bezel region, a left bezel region, and a right bezel region, the lower bezel region is positioned at a lower end of the display region, the left bezel region is positioned at a left end of the display region, and the right bezel region is positioned at a right end of the display region;
    a terminal region provided with a connecting terminal, wherein the terminal region comprises a first terminal region and a second terminal region, the first terminal region is positioned in an intermediate region and an edge region of the lower bezel region, and the second terminal region is positioned in at least one of the left bezel region or the right bezel region, wherein an included angle between a longitudinal direction of a first connecting terminal and a lower bezel in the first terminal region meets a preset condition, and a width of the first connecting terminal is greater than a threshold; and
    a driving circuit and a connecting layer, wherein the driving circuit comprises a driving chip and a connecting member, one end of the connecting member is connected to the driving chip, another end of the connecting member is provided with a driving terminal, wherein the driving terminal corresponds to the connecting terminal, and the connecting layer is used to bond the driving terminal and the connecting terminal;

wherein the connecting member comprises a first connecting unit provided with a first driving terminal, and the first connecting unit corresponds to the first terminal region.

2. The display panel according to claim 1, wherein the first connecting terminal is perpendicular to the lower bezel.

3. The display panel according to claim 1, wherein an included angle between a longitudinal direction of a second connecting terminal and the left bezel in the second terminal region meets the preset condition, and a width of the second connecting terminal is greater than the threshold.

4. The display panel according to claim 1, wherein the left bezel region and the right bezel region are both provided with the second terminal region, the second connecting terminal of the second terminal region is connected to a gate driver on array (GOA) circuit in the left bezel region, and the second connecting terminal of the second terminal region is connected to an antistatic circuit in the right bezel region.

5. The display panel according to claim 1, wherein the left bezel region and the right bezel region are both provided with the second terminal region, and the second connecting terminal of the second terminal region in the left bezel region and the second connecting terminal of the second terminal region in the right bezel region are both connected to a GOA circuit.

6. The display panel according to claim 1, wherein a number of the first terminal region is plural, and each of the first terminal regions is equal in width.

7. The display panel according to claim 1, wherein the connecting member further comprises a second connecting unit, a second driving terminal is disposed in the second connecting unit, and the second connecting unit corresponds to the second terminal region.

8. A display device, comprising a display panel, the display panel comprising:

a display region;
a non-display region disposed outside the display region, wherein the non-display region comprises a lower bezel region, a left bezel region, and a right bezel region, the lower bezel region is positioned at a lower end of the display region, the left bezel region is positioned at a left end of the display region, and the right bezel region is positioned at a right end of the display region;
a terminal region provided with a connecting terminal, wherein the terminal region comprises a first terminal region and a second terminal region, the first terminal region is positioned in an intermediate region and an edge region of the lower bezel region, and the second terminal region is positioned in at least one of the left bezel region or the right bezel region, wherein an included angle between a longitudinal direction of a first connecting terminal and a lower bezel in the first terminal region meets a preset condition, and a width of the first connecting terminal is greater than a threshold; and
a driving circuit and a connecting layer, wherein the driving circuit comprises a driving chip and a connecting member, one end of the connecting member is connected to the driving chip, another end of the connecting member is provided with a driving terminal, wherein the driving terminal corresponds to the connecting terminal, and the connecting layer is used to bond the driving terminal and the connecting terminal;
wherein the connecting member comprises a first connecting unit provided with a first driving terminal, and the first connecting unit corresponds to the first terminal region.

9. The display device according to claim 8, wherein the first connecting terminal is perpendicular to the lower bezel.

* * * * *